(12) United States Patent
Harpham

(10) Patent No.: US 6,677,824 B2
(45) Date of Patent: Jan. 13, 2004

(54) CHANGING THE OUTPUT FREQUENCY OF A PHASE-LOCKED LOOP

(75) Inventor: Simon Harpham, Southampton (GB)

(73) Assignee: Sony United Kingdom Limited, Weybridge (GB)

( * ) Notice: Subject to any disclaimer, the term of this patent is extended or adjusted under 35 U.S.C. 154(b) by 4 days.

(21) Appl. No.: 09/735,212

(22) Filed: Dec. 12, 2000

(65) Prior Publication Data

US 2001/0017572 A1 Aug. 30, 2001

(30) Foreign Application Priority Data

Dec. 13, 1999 (GB) ............................................... 9929430

(51) Int. Cl.$^7$ ................................................. H03L 7/00
(52) U.S. Cl. ........................... 331/17; 331/14; 331/17; 327/156; 327/157; 327/159; 327/160
(58) Field of Search ............................ 331/1 A, 17, 14; 327/156, 157, 159, 160

(56) References Cited

U.S. PATENT DOCUMENTS 6,028,905 A * 2/2000 Gaines ........................ 375/376

* cited by examiner

*Primary Examiner*—Arnold Kinkead
(74) *Attorney, Agent, or Firm*—Frommer Lawrence & Haug LLP; William S. Frommer; Gordon Kessler

(57) ABSTRACT

A phase-locked loop (PLL) 1 is provided with means for changing the frequency of the output signal to a desired frequency. The PLL 1 is operated during a first period with a feedback frequency division ratio set to an initial value N' which controls the conduction time of the charge pumps during a first period having a predetermined length to place an amount of charge on the loop filter 6 during the first period sufficient to produce a control voltage for controlling the voltage-controlled oscillator 10 to output an output signal substantially at the desired output frequency. At the end of the first period, the feedback loop 11 is opened by disabling the charge pump 5 for a second period to allow the control voltage output from the loop filter 6 to settle. Subsequently the feedback loop 6 is closed and the feedback frequency division ratio is set to a proper value $N_2$ such that operation of the PLL 1 subsequent to the second period locks the output frequency to the desired frequency. The proper and initial values are stored in a main register 31 and a shadow register 32, respectively, which are switched in response to an S counter 36 counting predetermined numbers of comparison periods defining the first and second periods.

39 Claims, 2 Drawing Sheets

CHANGING THE OUTPUT FREQUENCY OF A PHASE-LOCKED LOOP

FIELD OF THE INVENTION

The present invention relates to a phase-locked loop (PLL) arranged to facilitate changing of the output frequency to a desired frequency. The present invention also relates to a method of changing the output frequency of a PLL.

DESCRIPTION OF THE RELATED ART

Typically, a PLL comprises a charge pump, a phase comparator for controlling the charge pump to conduct for a time equal to the phase difference between a comparison frequency signal and feedback signal, a loop filter for filtering the output of the charge pump to output a control voltage, a voltage-controlled oscillator (VCO) for outputting an output signal having a frequency controlled by the control voltage output from the loop filter, and a feedback loop for feeding back the output signal to the phase comparator as said feedback signal and including a feedback frequency divider for frequency the signal on the feedback loop.

In a single-loop, integer-N PLL, the charge pumped onto the loop filter is set entirely by the transient error ratio between the current frequency and the desired output frequency. The conduction time of the charge pump generating the transient is entirely controlled by the dynamics of the closed loop. The PLL is an example of a sampled data control system which will display "inertia" under transient conditions due to charge transfer between the capacitors in the loop filter, typically an integration capacitor and a damping capacitor. As a result of this inherent inertia in the feedback loop, the control voltage is caused to overshoot the desired steady state value so that additional time is required for the control voltage and hence the frequency of the output signal to settle. Therefore, there is ringing in the control voltage until the loop servos out the error introduced by the control voltage overshooting, as the control voltage converges on its steady state value. This settle time of the loop to a particular error, known as its lock time is determined by the loop filter component values.

The present invention is intended to provide a PLL which minimises the settle time whilst maintaining a circuit structure which is easily implemented and reliable.

Attempts to date to decrease the settle time have relied upon increasing the magnitude of the charge pump gain to achieve an increase in the charge dumped onto the loop. However, such increase in the charge pump gain can cause instability in the loop dynamics. Attempts have been made to stabilise a higher gain mode by switching in additional damping in the loop filter. However, this is not desirable in an integrated solution as the need to switch additional damping capacitors and resistors increases the pin count of the IC card implementing the PLL. Furthermore, such switching in itself can cause problems as any switch inevitably has capacitance. Therefore, whilst such PLLs are effective to reduce the settle time somewhat, it would be desirable to produce the settle time further and to provide a more convenient PLL implementation.

SUMMARY OF THE INVENTION

According to a first aspect of the present invention, there is provided a method of operating a phase-locked loop comprising: a charge pump; a phase comparator for controlling the charge pump to conduct for a time equal to the phase difference between a comparison frequency signal and feedback signal; a loop filter for filtering the output of the charge pump to output a control voltage; a voltage-controlled oscillator for outputting an output signal having a frequency controlled by the control voltage output from the loop filter; and a feedback loop for feeding back the output signal to the phase comparator as said feedback signal and including a feedback frequency divider for frequency the signal on the feedback loop; the method comprising changing the frequency of the output signal by:

for a first period having a predetermined length, controlling the conduction time of the charge pump to place an amount of charge on the loop filter during the first period sufficient to produce a control voltage for controlling the voltage-controlled oscillator to output an output signal substantially at the desired output frequency; and subsequently operating the phase-locked loop with a feedback frequency division ratio set to a proper value for locking the output frequency to the desired frequency.

According to a second aspect of the present invention there is provided a phase-locked loop comprising: a charge pump; a phase comparator for controlling the charge pump to conduct for a time equal to the phase difference between a comparison frequency signal and feedback signal; a loop filter for filtering the output of the charge pump to output a control voltage; a voltage-controlled oscillator for outputting an output signal having a frequency controlled by the control voltage output from the loop filter; and a feedback loop for feeding back the output signal to the phase comparator as said feedback signal and including a feedback frequency divider for frequency the signal on the feedback loop; wherein the phase-locked loop further comprises means for changing the frequency of the output signal to a desired frequency, comprising:

means for controlling the conduction time of the charge pump during a first period having a predetermined length to place an amount of charge on the loop filter during the first period sufficient to produce a control voltage for controlling the voltage controlled oscillator to output an output signal substantially at the desired output frequency; and means for setting the feedback frequency division ratio to a proper value such that subsequent operation of the phase-locked loop locks the output frequency to the desired frequency.

Accordingly, the present invention allows the settle time to be increased by maintaining the slew rate of the loop filter at a high value during the first period. In other words, the present invention accelerates the provision of an appropriate amount of charge to the loop filter it may be termed a "charge accelerator". In particular, this is done by controlling the conduction time of the charge pump to place an amount of charge on the loop filter sufficient to produce the necessary change in the control voltage provided to control the VCO. This allows the change to be placed on the loop filter more rapidly. In contrast the known PLLs require a large number of charge pump pulses to traverse the desired change in output frequency when the loop is operated normally by immediately setting the feedback frequency division ratio to its proper value for changing the output frequency.

Preferably at the end of the first period the feedback loop is opened for a second period to allow the control voltage output from the loop filter to settle and subsequently the feedback loop is closed.

In the second period, the charge pump is disabled to allow the control voltage on the loop filter to settle. During this time charge shuffles between the capacitors in the loop filter. For example, if the loop filter has an integration capacitor and a damping capacitor, charge may shuffle from the integration capacitor to the damping capacitor causing a slight decay in the control voltage. The overall settle time of the PLL is reduced if the charge pump is disabled in the second period, because the correct amount of charge has already been placed on the loop filter. If the feedback loop were closed during this period, the charge pump would cause additional amounts of charge to be pumped onto the loop filter. Although, through the feedback in the PLL, such charge pump pulses would eventually drive the control voltage to the desired value, the settle time would be increased.

Opening the feedback loop for the second period is preferred to reduce the settle time of the PLL, particularly if the first period is a single pulse. However it is not essential and is of less importance when the first period consists of plural control pulses because in that case the loop settles between each of the control pulses.

Subsequently, the loop is closed once again and the PLL operated normally with the feedback frequency division ratio set to the proper value necessary to lock the output frequency to the desired frequency.

The present invention allows the use of a charge pump which outputs a current having a fixed amplitude. Keeping the charge pump gain constant in this way allows the loop dynamics to remain predictable and therefore prevents instability.

Similarly, the present invention allows the dynamics of the loop filter to be maintained constant. Therefore, switching is avoided during the initial ramping of the loop filter voltage which avoids the problems associated with providing switching in the loop filter.

Preferably during the first predetermined period, the conduction time of the charge pump is controlled by operating the phase-locked loop with a feedback frequency division ratio set to an initial value other than the proper value. This provides a simple and convenient way of controlling the conduction time. For example, the initial value of the feedback frequency division ratio may be stored in a shadow register and supplied to the feedback frequency divider in sequence with the proper value stored in a main register.

The initial value may be determined based on the capacitance of the loop filter, the amplitude of the current output by the charge pump and the gain of the VCO.

Preferably, the first period is found by counting a first predetermined number of comparison periods of the phase comparator, for example by counting the reset pulses of the phase comparator.

To minimise the settle time, the first period is one comparison period of the phase comparator. By placing a sufficient amount of charge on the loop filter over a single comparison period the control voltage is changed as quickly as possible.

However, in a low voltage application, for example a mobile telephone, the charge pumps have a limited voltage headroom. In such a case, it is necessary for the first period to be a plural number of comparison periods, typically 10 to 20 periods. This minimises the voltage headroom required by the charge pumps, thereby allowing a low voltage application to traverse the change in output frequency in a minimum number of comparison periods.

Advantageously, the second period is determined by counting a second predetermined number of comparison periods of the phase comparator. This provides a simple method of determining the second period. The number of circuit elements can be reduced by using the same counter means as for counting the first period.

LIST OF DRAWINGS

DETAILED DESCRIPTION

To allow better understanding, an embodiment of the present invention will now be described by way of non-limitative example with reference to the drawings.

Figure 1:
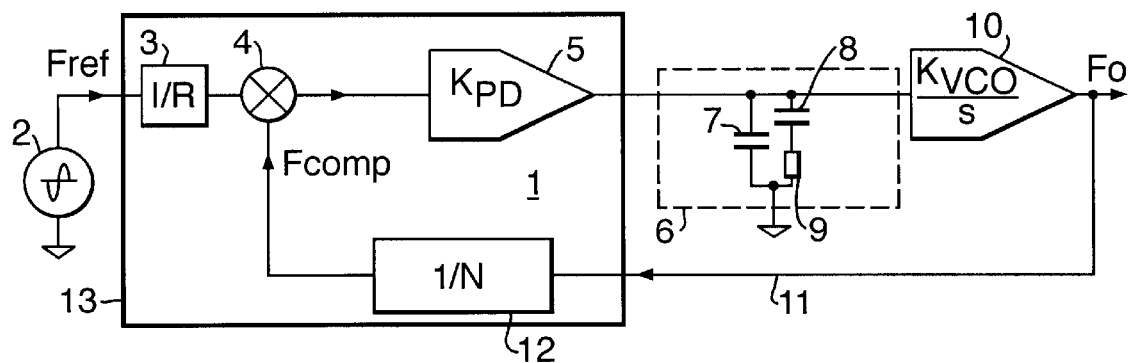
FIG. 1 illustrates a single loop, integer-N PLL to which the present invention is applied.

FIG. 1 illustrates a single-loop, integer-N PLL 1 to which the present invention is applied. A reference source 2 is used to generate a reference frequency signal $F_{ref}$ which is supplied to a reference frequency divider 3 which divides the reference frequency signal by an integral reference division ratio R to generate a comparison frequency signal. The comparison frequency signal is supplied to a phase comparator 4 which compares the phase difference between the comparison frequency signal and a feedback signal and controls a charge pump 5 to conduct for a time equal to the phase difference, so the charge pump 5 therefore acts as a switched current source.

The charge pump 5 pumps a passive loop filter 6. As illustrated in FIG. 1, the loop filter 6 includes an integration capacitor 7 having a capacitance $C_1$ connected in parallel with the output of the charge pump 5. The loop filter 6 also includes a damping capacitor 8 having a capacitance $C_2$ in series with a damping resistor 9 having a resistance $R_2$, the shunt arrangement of the damping capacitor 8 and damping resistor 9 in series constituting a low-pass filter in parallel with the output of the charge pump 5. This loop filter structure is preferred for simplicity. Any suitable active or passive loop filter could alternatively be used.

The loop filter 6 acts to filter the output of the charge pump 5 and outputs a control voltage which is supplied to a VCO 10 which outputs the output signal $F_0$ of the PLL 1 having a frequency controlled by the control voltage output from the loop filter 6.

The output signal $F_0$ is supplied through a feedback loop 11 including feedback frequency divider 12 within the feedback loop 11 which frequency divides the outputs signal $F_0$ by a feedback frequency division ratio N. The frequency divided signal is supplied to the phase comparator 4 as the feedback signal for comparison with the comparison frequency signal.

In normal operation, the phase comparator 4 switches the charge pump 5 to generate a transient current pulses, having a conduction time equal to the phase difference between the feedback signal and the comparison frequency signal. The current pulses as filtered by the loop filter 6 to generate a control voltage for the voltage VCO 10 tending to change the output signal $F_0$ to reduce the phase difference between the feedback signal and the comparison frequency signal. Accordingly, operation of the PLL 1 locks the feedback signal to the comparison frequency signal. Thus the output signal $F_0$ is locked to the reference signal $R_{ref}$ with a frequency ratio given by the following equation.

$$F_0 = (N/R) \cdot F_{ref} \tag{1}$$

Alteration of the feedback frequency division ratio N and the reference frequency division ratio R allows the frequency of the output signal $F_0$ to be controlled.

Figure 2:
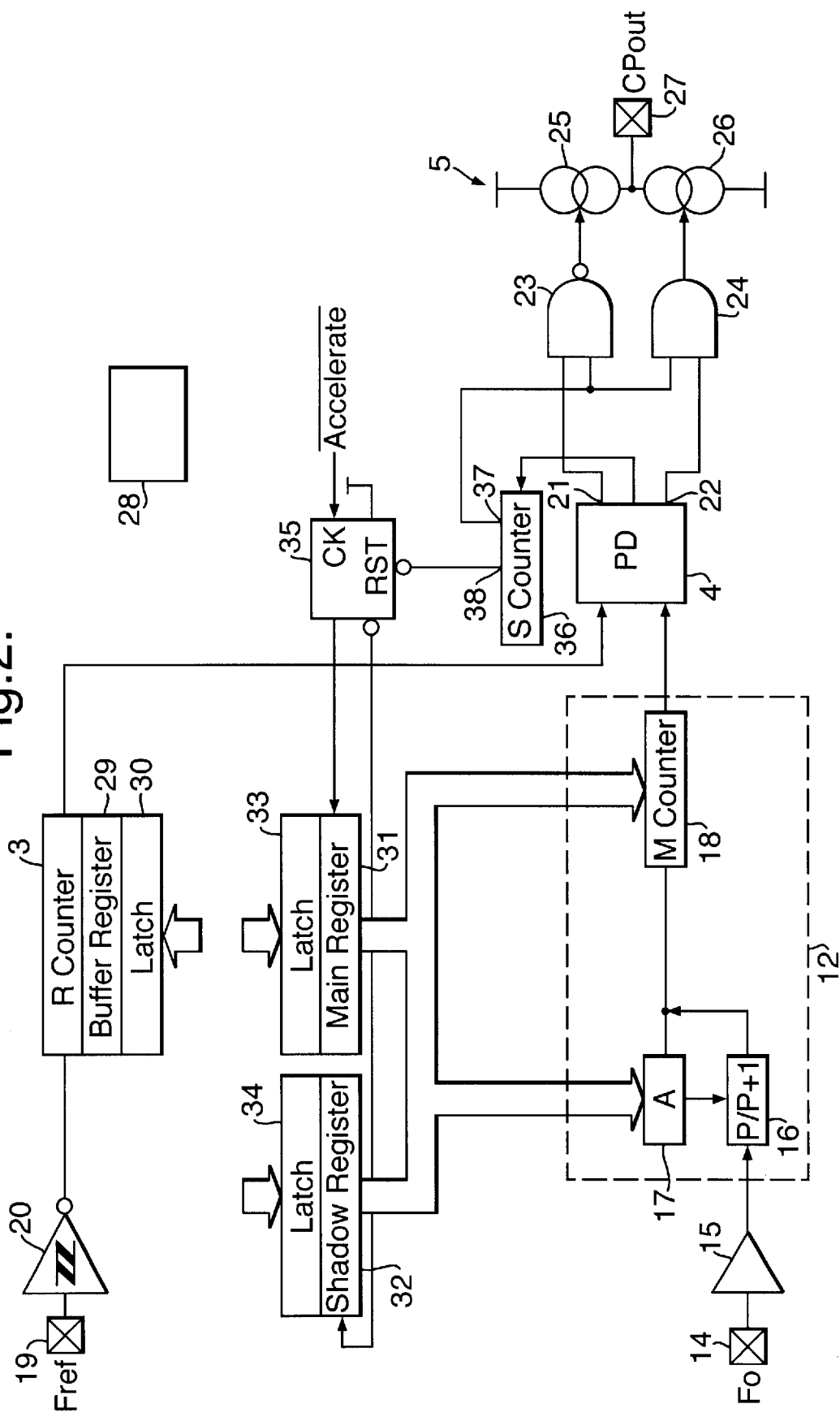
FIG. 2 illustrates the PLL synthesizer chip within the PLL of FIG. 1.

The reference frequency divider 3, the comparator 4, the charge pump 5 and the feedback frequency divider 12 are all included on a single IC (integrated circuit) PLL synthesizer chip 13 which is illustrated in more detail in FIG. 2. Optionally, to reduce the scale of the PLL 1 as a whole, the VCO 10 may also be integrated on the IC chip 13.

The output frequency $F_0$ is supplied to a first input pin 14 of the IC chip 13 connected to a buffer amplifier 15 which converts the output signal to a digital signal having the same frequency.

The converted output signal is passed through the feedback frequency divider 12 which consists of a dual modulus pre-scaler 16 controlled by a swallow counter 17, and a main counter 18. The dual modulus pre-scaler 16 frequency divides the output signal of the PLL 1 by an integral ratio of either P or (P+1). The swallow counter 17 counts the output pulses from the dual modulus pre-scaler 16 and controls the frequency division ratio of the dual modulas pre-scaler 16 to be: (P+1) for A counts of the output of the dual modulas pre-scaler 16 in a set of M counts, where M is the main frequency division ratio of the main counter 18; and P for the remaining counts in the set. Accordingly, the feedback frequency divider circuit 12 has an integral division ratio given by the equation.

$$N = M \cdot P + A \qquad (2)$$

The frequency divided signal output from the feedback frequency divider 12 is fed as a feedback signal to a first input of the phase detector 4.

The reference frequency $F_{ref}$ is fed to a second input pin 19 of the IC chip 13 through a Schmitt trigger 20 which converts the reference signal to a digital signal having the same frequency. Frequency division is performed by the reference frequency divider 3, and the frequency divided signal is fed to the second input of the phase comparator 4 as a comparison frequency signal to provide a point of time reference.

The phase comparator 4 compares the phase of the comparison frequency signal with the phase of the feedback signal and outputs control pulses $V_{up}$ and $Vd_{down}$ from outputs 21 and 22 respectively. Each control pulse $V_{up}$ and $V_{down}$ has a length equal to the phase difference between the compared signals, but $V_{up}$ indicates that the feedback signal lags the comparison frequency signal so that the output frequency must be raised, whereas $V_{down}$ indicates that the reference signal lags the feedback signal so that output frequency must be lowered. The control pulses $V_{up}$ and $V_{down}$ are fed through logic gates 23 and 24 (which operate as described in detail below) to control respective current sources 25 and 26 which together constitute the charge pump 5. The current sources 25 and 26 output a current pulse of the same constant amplitude $K_{pd}$ for the period of the respective control pulse $V_{up}$ or $V_{down}$ to an output pin 27 of the IC chip 13. The current source 25 outputs a positive current to increase the charge on the loop filter 6 whereas the current source 26 outputs a negative pulse to decrease the charge on the loop filter 6.

A control CPU 28 is provided on the IC chip to perform various control and setting functions as described below.

The reference frequency divider 3 is provided with a register 29 which holds the reference frequency division ratio R. The register 29 receives the reference frequency division ratio R from a latch 30 which is loaded by the CPU 28.

The feedback frequency divider 12 is provided with a main register for holding the proper value of the feedback frequency division ratio N equal to the ratio of the desired output frequency to the comparison frequency, and also a shadow register 32 for holding an initial value N' of the feedback frequency division ratio. The main register 31 receives the feedback frequency division ratios from respective latches 33 and 34 which are both loaded by the CPU 28.

The registers 29, 31 and 32 are provided to synchronise supply of the frequency division ratios to the frequency dividers 3 and 12 with the counter pulses within the frequency dividers 3 and 12. The latches 30, 33 and 34 are provided to synchronise supply of the frequency division ratios to the registers 29, 31 and 32 with the system clock. The absence of such synchronisation can cause timing errors to occur such that periodically the new frequency division ratio coincides with the system clock or counter pulse such that it is not properly supplied causing the PLL to malfunction.

The main register 31 and the shadow register 32 are controlled by the output and the negated output, respectively, of a D-type flip-flop 35. The clock input of the D-type flip-flop 35 may be poled as an Accelerate address to change its output to a logical one. Reset of the D-type flip-flop 35 changes the output back to a logical zero. The main register 31 and the shadow register 32 are controlled to supply their respective values of the feedback frequency division ratio N to the feedback frequency divider 12 when they receive a logical one from the D-type flip-flop. Therefore, after poling of the Accelerate address of the D-type flip-flop 35, the initial value stored in the shadow register 32 is controlled to set the feedback frequency divider 12 with the limited value and after reset of the D-type flip-flop 35, in the main register 31 is controlled to set the feedback frequency divider 12 with the proper value.

An S counter 36 is provided to count the reset pulses from the phase comparator 4 and thereby to count comparison periods of the PLL 1. The reset pulses are created by the phase comparator 4 after a rising edge of both the comparison frequency signal and the feedback signal has been input. Alternatively, the S counter could be arranged to count comparison periods by counting the pulses of the comparison frequency signal itself, or to count the reference signal $F_{ref}$.

The S counter 36 has a first output 37 connected to the input of both logic gates 23 and 24. This first output 37 outputs a logical zero when the S counter 36 reaches a first predetermined number $S_1$. Logic gate 23 is a NAND gate and logic gate 24 is an AND gate so the effect of the first output 37 becoming logical zero is to turn off both logic gates 23 and 24 so that both current sources 25 and 26 are turned off regardless of the state of the control pulses $V_{up}$ and $V_{down}$ output from the phase comparator 4. The logic gate 23 is a NAND gate and because current source 25 is controlled by negative logic. Any appropriate logic circuit could be used in place of the logic gates 23 and 24 to disable the current sources 25 and 26 of the charge pump 5.

The reset output 38 of the S counter 36 is connected to the reset input of the D-type flip-flop 35. When the S counter 36 reaches a second predetermined number $S_2$ beyond the first predetermined number $S_1$, the S counter 36 resets which has two effects. Firstly, a logical one is supplied to the logic gates 23 and 24, thereby allowing the next control pulses $V_{up}$ and $V_{down}$ from the phase comparator 4 to switch the current sources 25 and 26 and therefore enabling the charge pump 5. Secondly, the S counter 36 resets the D-type flip-flop 35 so that the proper value of the frequency division ratio N stored in the main register 31 is set to the reference frequency divider 12.

The operation of the PLL 1 will now be described.

Normal operation of the PLL 1 with an original feedback frequency division ratio $N_1$ causes the output signal to be locked to a frequency $F_0$ given by equation (1) with $N=N_1$. To effect a change in output frequency of the PLL 1 to a new frequency given by equation (1) with $N=N_2$, the CPU 28 operating under the control of a program performs the operations of: loading the frequency division ratios R, $N_2$, N' to the latches 30, 33 and 34 to set in the registers 29, 31 and 32; poling the Accelerate address; and jamming the S counter values $S_1$ and $S_2$ in the S counter 36 and resetting the count of the S counter 36 to zero. The basis on which these ratios and counter values are set are described in more detail below.

For a first period, the feedback frequency divider 12 is set with the initial value N' stored in the shadow register 32, because the Accelerate address of the D-type flip-flop 35 has been poled. N' is selected to control the coinduction time of the charge pump 5 to place a total amount of change on the loop filter over $S_1$ comparison periods period sufficient to produce a change in the control voltage to control the VCO 10 to produce the desired change in the output frequency. For each comparison period of the first period the charge pump is controlled to conduct for a time controlled by the initial value N' of the feedback frequency division ratio. Therefore, the control voltage on the loop filter 6 rises rapidly over the first period.

When the S counter 36 has counted $S_1$ comparison periods, the output 37 of the S counter 36 turns the logic gates 23 and 24 off thereby disabling the charge pump 5 and opening the feedback within the PLL 1. Although the phase comparator 4 still operates normally and supplies control pulses $V_{up}$ and $V_{down}$ to the logic gates 23 and 24, the logical zero from the S counter 36 holds the output of the logic gates 23 and 24 off and hence holds the current sources 25 and 26 off so that no charge is supplied to the loop filter 6. Therefore, the PLL 1 effectively goes open loop and the voltage on the loop filter is allowed to settle. Provided the second period is long enough, it will settle to a value for controlling the VCO 10 to be substantially at the desired output frequency as a result of having been controlled the conduction time of the charge pump 5 during the first period by operating the PLL 1 with the initial value N' of the feedback frequency division ratio.

The charge pump 5 is disabled for a second period until the S counter 36 counts $S_2$ reset pulses of the phase comparator 4. Then the S counter 36 is reset which causes the output 37 of the S counter 36 to become a logical one which enables the logic gates 23 and 24, thereby enabling the charge pump 5 for the subsequent comparison period and closing the PLL 1. Simultaneously, reset of the S counter 36 resets the D-type flip-flop 5 and consequently the main register 31 and the shadow register are controlled so that the proper value $N_2$ stored in the main register 31 is set to the feedback frequency divider 12 instead of the initial value $N_1$ stored in the shadow register 32. As a result of closing the PLL 1 and setting the proper value $N_2$ to the feedback frequency divider 12, the PLL 1 operates normally to lock the output frequency of the VCO 10 to the desired frequency controlled by the proper value $N_2$ of the feedback frequency division ratio as given by equation (1).

The present invention is embodied in the IC chip 13 as illustrated in FIG. 2 which is supplied to be used in a variety of particular systems. The designer of any given system provided with the IC chip 13 programs the CPU 28 to set the frequency division ratios $N_2$, N' and R, to pole the Accelerate address of the D-type flip-flop and to set the values $S_1$ and $S_2$ to the S counter 36 on the following basis.

To maximise the speed at which the control voltage is changed and thereby to minimise the settle time of the PLL 1, the first count value $S_1$ of the S counter 36 is set to be one. This means that the total amount of charge necessary to produce the desired change in output frequency is placed in the loop filter by a single conduction period of the charge pump 5 in a single comparison period. However, in low voltage applications in order to minimise the voltage headroom required by the current sources 25 and 26 of the charge pump 5, then in order to traverse a large frequency step it is necessary to place the charge on the loop filter 6 over a first period of a plural number of comparison periods so $S_1$ is a plural number. Typically this will be 15 comparison periods which the PLL 1 is used as a local oscillator in a mobile telephone. In this case it becomes less important to open the feedback loop during the second period because the control voltage on the loop filter settles (by decaying) after each of the control pulses so is not far off the desired voltage at the end of the second period.

The initial value N' of the feedback frequency division ratio is set to an appropriate value to control the total amount of charge placed on the loop period during the first period. Therefore, the initial value N' of the feedback division ratio is determined based on the total capacitance $C_t$ of the loop filter 6 (which is equal to ($C_1+C_2$) when using the loop filter 6 illustrated in FIG. 1); the amplitude $K_{pd}$ of the current output by the charge pump 5 and the gain $K_{VCO}$ of the VCO 10, as well as the length of the first period. For example, when the first period is a single comparison period ($S_1=1$), by using an initial value N' of the feedback frequency division ratio changed from the previous value $N_1$ by an amount dN so that $N'=N_1+dN$ then the conduction time $t_{on}$ of the charge pump S is given by the following equation.

$$t_{on} = \frac{N_1 + dN}{F_o} - \frac{N_1}{F_o} = \frac{dN}{F_o} \tag{3}$$

The change in the control voltage V on the loop filter 6 is related to the current I output from the charge pump by the equation $$C_t \cdot \frac{dV}{dt} = I \tag{4}$$

As the current I is a pulse of amplitude of $K_{pd}$ having a conduction time $t_{on}$ by integrating equation 4 the change in the control voltage can be given by the equation $$dV = \frac{K_{pd}}{C_1} \cdot t_{on} \tag{5}$$

This assumes conservation of charge on the capacitors of the loop filter 6.

Thus the change in the output frequency $df_0$ is given by the equation $$dF_o = \frac{K_{vco} \cdot K_{pd}}{C_t} \cdot t_{on} \tag{6}$$

As in equation (1), the current output frequency $F_0$ is related to the comparison period $t_{comp}$ by the equation $$F_0 = N_1/t_{comp} \tag{7}$$

Combining equations (3), (6) and (7) we obtain an equation giving the necessary change dN in the current value $N_1$ of the feedback frequency division ratio to effect a change in the output frequency of $dF_O$ in a single step, namely $$dN/N_1 = \frac{C_t \cdot dF_o}{K_{vco} \cdot K_{pd} \cdot t_{comp}} = \alpha \cdot dF_o \quad (8)$$

Therefore, the initial value N' inserted in the shadow register 32 is given by the equation $$N' = N_1(1 + \alpha \cdot dF_0) \quad (9)$$

In the case that it is necessary for the first period to be a plural number of comparison periods, the initial value N' can be calculated by calculating the change in the frequency for each comparison period for a given initial value $N'=N_1+dN$ using a similar calculation to that set out above but repeated recursively. This 20 recursive process produces an equation that is a complication function of the change in the feedback frequency division ratio dN, but the result is determinant and is relatively easily calculated by the system designer having regard to the properties of any given PLL 1, for example using a spreadsheet.

Alternatively, it would be possible to modify the PLL to provide a different 25 initial value for each comparison period of the first period, or in other words to provide a rolling change in the initial value for respective samples of the first period. Again this may be calculated in a straightforward manner by a recursive process based on the response of the loop filter 6. An exact mathematical expression is difficult to set out, although an approximate solution is as follows.

One may consider ramping the control voltage over $S_1$ comparison periods and setting a nominal change in frequency $dF_S$ in the S-th comparison period (i.e. $1 < S \leq S_1$) so that the overall change in frequency is given by the equation $$\sum_{S=1}^{S=S1} dF_S = dF_o \quad (10)$$

In that case, from equations (8) and (9), it will be seen that the initial value $N'_1$ for the first comparison period is given by the equation $$N'_{(1)} = N_1(1 + \alpha \cdot dF_1) \quad (11)$$

and the initial value $N'_S$ for the S-th subsequent comparison period is given by the recursive equation $$N'_{(S)} = N'_{(S-1)}(1 + \alpha \cdot dF_S) \quad (12)$$

If the nominal changes $dF_S$ in frequency are equal, they will be $dF_O/S_1$ so the initial value for the S-th comparison period will be given by the equation $$N'_{(S)} = N_1\left(1 + \frac{\alpha \cdot dF_o}{S_1}\right)^S \quad (13)$$

Of course, it would alternatively be possible to control the conduction time of the pump over the first period by setting the reference frequency division ratio R to an appropriate initial value during the first period, instead of controlling the feedback frequency division ratio N or as well as controlling the feedback frequency division ratio N.

Due to the granularity of the control resulting from the fact N' is integrated, it will not always be possible to find a value of N' which gives precisely the correct control voltage but a value of N' is selected so that the control voltage brings the output frequency close to the frequency. The granularity also means the user may program the CPU 28 to avoid using the charge accelerator to control the conduction time of the charge pump during the first period, for example when the change in the output frequency is small. In this case, the Accelerate address is not poled, so that the proper value $N_2$ of the feedback frequency division ratio from the main register 31 is always set to the feedback frequency divider 12 to effect a change in output frequency. Thus the Accelerate address provides means for selectively controlling the operation of the PLL 1.

The second count value $S_2$ is selected to be sufficiently high to allow the control voltage on the loop filter 6 to settle having regard to the properties of the loop filter 6. Alternatively, instead of using the second count value $S_2$ to control the length of the second period, it would be possible to use a lock detector to detect when the control voltage has settled to a value near lock.

As an alternative it is possible to repeat the steps of controlling the conduction time of the charge pump for a first period and then opening the feedback loop to allow the control voltage to settle one or more times before subsequently operating the feedback loop normally with the proper value $N_2$ set to the feedback frequency divider.

Figure 3:
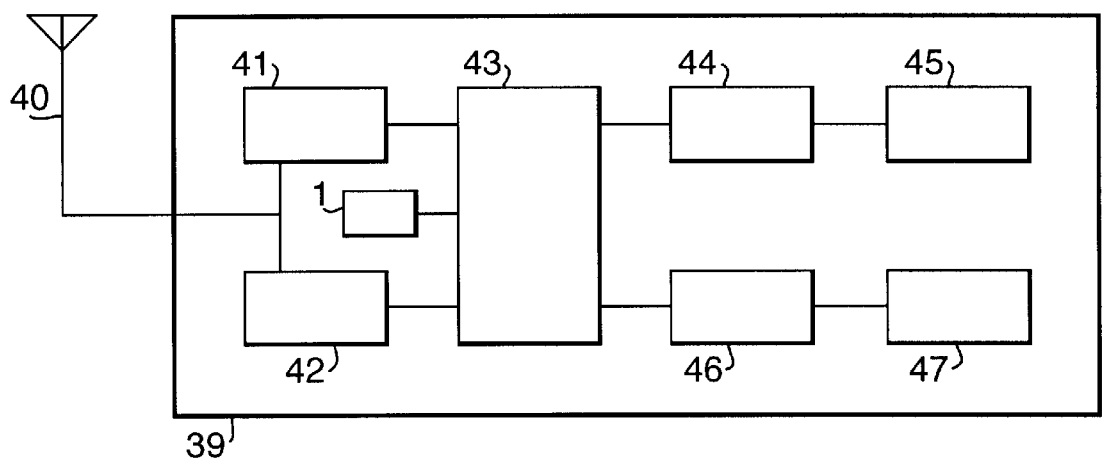
FIG. 3 illustrates a mobile telephone in which the PLL of FIG. 1 is employed as a local oscillator.

A mobile telephone 39 employing the PLL 1 as a local oscillator is illustrated in FIG. 3. The output of the PLL 1 is fed to a mixer 43 where it is used as a local oscillator signal to frequency convert the reception signal received from an antenna 40 through a reception circuit 41. The converted reception signal is supplied to a demodulator circuit 44 to generate an audio signal which is supplied to the speaker 45. Similarly an audio signal received by a microphone 47 is modulated by a modulator 46 and supplied to the mixer 43 which frequency converts using the output of the PLL 1. This creates a transmission signal which is supplied to the transmitter circuit 42 for transmission by the antenna 40.

What is claimed is:

1. A method of operating a phase-locked loop comprising:
    a charge pump;
    a phase comparator for controlling the charge pump to conduct for a time equal to a phase difference between a comparison frequency signal and feedback signal;
    a loop filter for filtering an output of the charge pump to output a control voltage;
    a voltage-controlled oscillator for outputting an output signal having a frequency controlled by the control voltage output from the loop filter; and
    a feedback loop for feeding back the output signal to the phase comparator as said feedback signal and including a feedback frequency divider for frequency dividing the output signal on the feedback loop;
    the method comprising changing the frequency of the output signal by:
        for a first period of having a predetermined length, controlling the conduction time of the charge pump to place an amount of charge on the loop filter during the first period sufficient to produce a control voltage for controlling the voltage-controlled oscillator to output an output signal substantially at the desired output frequency;
        subsequently operating the phase-locked loop with a feedback frequency division ratio set to a proper value for locking the output frequency to the desired frequency, and at the end of the first period opening the feedback loop for a second period to allow the control voltage output from the loop filter to settle and subsequently closing the feedback loop.

2. A method according to claim 1, wherein dynamics of the loop filter are maintained constant.

3. A method of operating a phase-locked loop according to claim 1,
wherein the opening and closing of the feedback loop is performed by disabling and enabling the charge pump.

4. A method of operating a phase-locked loop comprising:
a charge pump;
a phase comparator for controlling the charge pump to conduct for a time equal to the phase difference between a comparison frequency signal and feedback signal;
a loop filter for filtering the output of the charge pump to output a control voltage;
a voltage-controlled oscillator for outputting an output signal having a frequency controlled by the control voltage output from the loop filter; and
a feedback loop for feeding back the output signal to the phase comparator as said feedback signal and including a feedback frequency divider for frequency dividing the output signal on the feedback loop,
the method comprising changing the frequency of the output signal by:
for a first period having a predetermined length, operating the phase-locked loop with a feedback frequency division ratio set to an initial value selected to control the conduction time of the charge pump to place an amount of charge on the loop filter during the first period sufficient to produce a control voltage for controlling the voltage-controlled oscillator to output an output signal substantially at the desired output frequency, wherein the initial value is determined based on the overall capacitance of the loop filter, the amplitude of the current output by the charge pump and the gain of the voltage-controlled oscillator; and
subsequently operating the phase-locked loop with a feedback frequency division ratio set to a proper value for locking the output frequency to the desired frequency.

5. A method according to claim 4,
wherein the first period is determined by counting a first predetermined number of comparison periods of the phase comparator.

6. A method according to claim 5, wherein said comparison periods are counted by counting reset pulses of the phase comparator.

7. A method according to claim 5, wherein the first predetermined number is one.

8. A method according to claim 7, wherein the conduction time of the charge pump is controlled by operating the phase-locked loop with a feedback frequency value set to an initial value N' given by the equation $$N' = N_1 \left(1 + \frac{dF_o \cdot C_t}{K_{vco} \cdot K_{pd} \cdot t_{comp}}\right)$$

where $N_1$ is the original value of the output frequency division ratio before change of the output frequency, $dF_0$ is the desired change in output frequency, $C_t$ is the overall capacitance of the loop filter, $K_{vco}$ is the gain of the voltage-controlled oscillator, $K_{pd}$ is the amplitude of the current output by the charge pump and $t_{comp}$ is the comparison period of the comparison frequency signal.

9. A method according to claim 5, wherein the first predetermined number is a plural number.

10. A method of according to claim 1,
wherein the second period is determined by counting a second predetermined number of comparison periods of the phase comparator.

11. A method according to claim 10, wherein said comparison periods are counted by counting the reset pulses of the phase comparator.

12. A method of operating a phase-locked loop comprising:
a charge pump;
a phase comparator for controlling the charge pump to conduct for a time equal to the phase difference between a comparison frequency signal and feedback signal;
a loop filter for filtering the output of the charge pump to output a control voltage;
a voltage-controlled oscillator for outputting an output signal having a frequency controlled by the control voltage output from the loop filter; and
a feedback loop for feeding back the output signal to the phase comparator as said feedback signal and including a feedback frequency divider for frequency dividing the output signal on the feedback loop,
the method comprising changing the frequency of the output signal by:
for a first period having a predetermined length, operating the phase-locked loop with a feedback frequency division ratio set to an initial value selected to control the conduction time of the charge pump to place an amount of charge on the loop filter during the first period sufficient to produce a control voltage for controlling the voltage-controlled oscillator to output an output signal substantially at the desired output frequency: and
subsequently operating the phase-locked loop with a feedback frequency division ratio set to a proper value for locking the output frequency to the desired frequency,
wherein the proper value and the initial value of the feedback frequency division ratio are stored in a main register and a shadow register, respectively, and the feedback frequency divider is set with the initial value from the shadow register during the first period and with the proper value from the main register subsequent a second period.

13. A phase-locked loop comprising:
a charge pump;
a phase comparator for controlling the charge pump to conduct for a time equal to the phase difference between a comparison frequency signal and feedback signal;
a loop filter for filtering the output of the charge pump to output a control voltage;
a voltage-controlled oscillator for outputting an output signal having a frequency controlled by the control voltage output from the loop filter; and
a feedback loop for feeding back the output signal to the phase comparator as said feedback signal and including a feedback frequency divider for frequency dividing the output signal on the feedback loop;

wherein the phase-locked loop further comprises means for changing the frequency of the output signal to a desired frequency, comprising:

means for controlling the conduction time of the charge pump during a first period having a predetermined length to place an amount of charge on the loop filter during the first period sufficient to produce a control voltage for controlling the voltage controlled oscillator to output an output signal substantially at the desired output frequency;

means for setting the feedback frequency division ratio to a proper value such that subsequent operation of the phase-locked loop locks the output frequency to the desired frequency; and means for opening the feedback loop at the end of the first period for a second period to allow the control voltage output from the loop filter to settle and subsequently closing the feedback loop.

14. A phase-locked loop according to claim 13, wherein the charge pump has a predetermined output amplitude.

15. A phase-locked loop according to claim 13, wherein dynamics of the loop filter are maintained constant.

16. A phase-locked loop according to claim 13,
wherein the means for opening and closing the feedback loop comprises means for enabling and disabling the charge pump.

17. A phase locked loop comprising:
a charge pump;
a phase comparator for controlling the charge pump to conduct for a time equal to the phase difference between a comparison frequency signal and feedback signal;
a loop filter for filtering the output of the charge pump to output a control voltage;
a voltage-controlled oscillator for outputting an output signal having a frequency controlled by the control voltage output from the loop filter; and
a feedback loop for feeding back the output signal to the phase comparator as said feedback signal and including a feedback frequency divider for frequency dividing the output signal on the feedback loop,
wherein the phase-locked loop further comprises means for changing the frequency of the output signal to a desired frequency, comprising:
means for setting the feedback frequency division ratio to an initial value during a first period having a predetermined length, the initial value being selected to control the conduction time of the charge pump to place an amount of charge on the loop filter during the first period sufficient to produce a control voltage for controlling the voltage-controlled oscillator to output an output signal substantially at the desired output frequency; and
means for setting the feedback frequency division ratio to a proper value such that subsequent operation of the phase-locked loop locks the output frequency to the desired frequency,
wherein said means for setting the feedback frequency division ratio includes a shadow register for storing the initial value controlled to supply the initial value to the feedback frequency divider during the first period.

18. A phase-locked loop according to claim 13, wherein the means for controlling is selectively operable during the first period either to perform said control of the conduction time of the charge pump by setting the feedback frequency division ratio to the initial value or to set the feedback frequency division ratio to said proper value.

19. A phase-locked loop comprising:
a charge pump;
a phase comparator for controlling the charge pump to conduct for a time equal to the phase difference between a comparison frequency signal and feedback signal;
a loop filter for filtering the output of the charge pump to output a control voltage;
a voltage-controlled oscillator for outputting an output signal having a frequency controlled by the control voltage output from the loop filter; and
a feedback loop for feeding back the output signal to the phase comparator as said feedback signal and including a feedback frequency divider for frequency dividing the output signal on the feedback loop;
wherein the phase-locked loop further comprises means for changing the frequency of the output signal to a desired frequency, comprising:
means for setting the feedback frequency division ratio to an initial value during a first period having a predetermined length, the initial value being selected to control the conduction time of the charge pump to place an amount of charge on the loop filter during the first period sufficient to produce a control voltage for controlling the voltage controlled oscillator to output an output signal substantially at the desired output frequency;
means for setting the feedback frequency division ratio to a proper value such that subsequent operation of the phase-locked loop locks the output frequency to the desired frequency; and
a counter arranged to count a first predetermined number of reset pulses of the phase comparator as said first period.

20. A phase-locked loop comprising:
a charge pump;
a phase comparator for controlling the charge pump to conduct for a time equal to the phase difference between a comparison frequency signal and feedback signal;
a loop filter for filtering the output of the charge pump to output a control voltage;
a voltage-controlled oscillator for outputting an output signal having a frequency controlled by the control voltage output from the loop filter; and
a feedback loop for feeding back the output signal to the phase comparator as said feedback signal and including a feedback frequency divider for frequency dividing the output signal on the feedback loop,
wherein the phase-locked loop further comprises means for changing the frequency of the output signal to a desired frequency, comprising:
means for setting the feedback frequency division ratio to an initial value during a first period having predetermined length, the initial value being selected to control the conduction time of the charge pump to place an amount of charge on the loop filter during the first period sufficient to produce a control voltage for controlling the voltage-controlled oscillator to output an output signal substantially at the desired output frequency; and
means for setting the feedback frequency division ratio to a proper value such that subsequent operation of the phase-locked loop locks the output frequency to the desired frequency; and a counter means arranged to count one comparison period of the phase comparator as said first period, wherein means for controlling the conduction time of the charge pump comprises means for supplying an initial value N' given by the equation $$N' = N\left(1 + \frac{dF_o \cdot C_t}{K_{vco} \cdot K_{pd} \cdot t_{comp}}\right)$$

where N is the original value of the output frequency division ratio before change of the output frequency, $dF_0$ is the desired change in output frequency, $C_t$ is the overall capacitance of the loop filter, $K_{vco}$ is the gain of the voltage-controlled oscillator, $K_{pd}$ is the amplitude of the current output by the charge pump and $t_{comp}$ is the comparison period of the comparison frequency signal.

21. A phase-locked loop according to claim 19, wherein the first predetermined number is a plural number.

22. A phase-locked loop according to claim 17, further comprising
a counter means arranged to count a first predetermined number of comparison periods of the phase comparator as said first period, wherein said means for opening and closing the feedback loop is responsive to the count of the counter means reaching said first predetermined number to open the feedback loop, and the counter means is arranged to count a second predetermined number of comparison periods as said second period and said means for opening and closing the feedback loop is responsive to the count of the counter means reaching said second predetermined number to close the feedback loop.

23. A phase-locked loop according to claim 22, wherein said means for setting the feedback frequency division ratio to the proper value is responsive to the counter reaching said second predetermined number.

24. A mobile telephone employing a phase locked-loop as a local oscillator, the phase-locked loop comprising:
a charge pump;
a phase comparator for controlling the charge pump to conduct for a time equal to the phase difference between a comparison frequency signal and feedback signal;
a loop filter for filtering the output of the charge pump to output a control voltage;
a voltage-controlled oscillator for outputting an output signal having a frequency controlled by the control voltage output from the loop filter; and
a feedback loop for feeding back the output signal to the phase comparator as said feedback signal and including a feedback frequency divider for frequency dividing the output signal on the feedback loop;
wherein the phase-locked loop further comprises means for changing the frequency of the output signal to a desired frequency, comprising:
means for controlling the conduction time of the charge pump during a first period having a predetermined length to place an amount of charge on the loop filter during the first period sufficient to produce a control voltage for controlling the voltage controlled oscillator to output an output signal substantially at the desired output frequency;
means for setting the feedback frequency division ratio to a proper value such that subsequent operation of the phase-locked loop locks the output frequency to the desired frequency; and
means for opening the feedback loop at the end of the first period for a second period to allow the control voltage output from the loop filter to settle and subsequently closing the feedback loop.

25. A method according to claim 3, wherein during the first predetermined period, the conduction time of the charge pump is controlled by operating the phase-locked loop with a feedback frequency division ratio set to an initial value other than the proper value.

26. A method according to claim 4, wherein dynamics of the loop filter are maintained constant.

27. A method according to claim 5, wherein the dynamics of the loop filter are maintained constant.

28. A method according to claim 10, wherein dynamics of the loop filter are maintained constant.

29. A method according to claim 10, wherein during the first predetermined period, the conduction time of the charge pump is controlled by operating the phase-locked loop with a feedback frequency division ratio set to an initial value other than the proper value.

30. A method according to claim 12, wherein dynamics of the loop filter are maintained constant.

31. A phase-locked loop according to claim 16, wherein the charge pump has a predetermined output amplitude.

32. A phase-locked loop according to claim 16, wherein dynamics of the loop filter are maintained constant.

33. A phase-locked loop according to claim 16, wherein said means for controlling the conduction time of the charge pump comprises means for setting the feedback frequency division ratio to an initial value other than the proper value.

34. A phase-locked loop according to claim 16,
a loop filter for filtering the output of the charge pump to output a control voltage;
a voltage-controlled oscillator for outputting an output signal having a frequency controlled by the control voltage output from the loop filter; and
a feedback loop for feeding back the output signal to the phase comparator as said feedback signal and including a feedback frequency divider for frequency dividing the output signal on the feedback loop;
wherein the phase-locked loop further comprises means for changing the frequency of the output signal to a desired frequency, comprising:
means for controlling the conduction time of the charge pump during a first period having a predetermined length to place an amount of charge on the loop filter during the first period sufficient to produce a control voltage for controlling the voltage controlled oscillator to output an output signal substantially at the desired output frequency;
means for setting the feedback frequency division ratio to a proper value such that subsequent operation of the phase-locked loop locks the output frequency to the desired frequency,
wherein the means for opening and closing the feedback loop comprises means for enabling and disabling the charge pump, and
wherein the means for controlling is selectively operable during the first period either to perform said control of the conduction time of the charge pump by setting the feedback frequency division ratio to set the feedback frequency division ratio to the initial value or to set the feedback frequency division ratio to said proper value.

35. A phase-locked loop comprising:

a charge pump;

a phase comparator for controlling the charge pump to conduct for a time equal to the phase difference between a comparison frequency signal and feedback signal;

a loop filter for filtering the output of the charge pump to output a control voltage;

a voltage-controlled oscillator for outputting an output signal having a frequency controlled by the control voltage output from the loop filter; and a feedback loop for feeding back the output signal to the phase comparator as said feedback signal and including a feedback frequency divider for frequency dividing the output signal on the feedback loop, wherein the phase-locked loop further comprises means for changing the frequency of the output signal to a desired frequency, comprising:

means for controlling the conduction time of the charge pump during a first period having a predetermined length to place an amount of charge on the loop filter during the first period sufficient to produce a control voltage for controlling the voltage controlled oscillator to output an output signal substantially at the desired output frequency;

means for setting the feedback frequency division ratio to a proper value such that subsequent operation of the phase-locked loop locks the output frequency to the desired frequency, wherein the means for setting the feedback frequency division ratio includes a main register for storing the proper value controlled to supply the proper value to the feedback frequency divider subsequent to the first period, and wherein the means for controlling is selectively operable during the first period either to perform said control of the conduction time of the charge pump by setting the feedback frequency division ratio to the initial value or to set the feedback frequency division ratio to said proper value.

36. A phase-locked loop according to claim 17, wherein the charge pump has a predetermined output amplitude.

37. A phase-locked loop according to claim 17, wherein dynamics of the loop filter are maintained constant.

38. A phase-locked loop according to claim 17, wherein the means for controlling is selectively operable during the first period either to perform said control of the conduction time of the charge pump by setting the feedback frequency division ratio to the initial value or to set the feedback frequency division ratio to said proper value.

39. A phase-locked loop comprising:

a charge pump;

a phase comparator for controlling the charge pump to conduct for a time equal to the phase difference between a comparison frequency signal and feedback signal;

a loop filter for filtering the output of the charge pump to output a control voltage;

a voltage-controlled oscillator for outputting an output signal having a frequency controlled by the control voltage output from the loop filter; and a feedback loop for feeding back the output signal to the phase comparator as said feedback signal and including a feedback frequency divider for frequency dividing the output signal on the feedback loop, wherein the phase-locked loop further comprises means for changing the frequency of the output signal to a desired frequency, comprising:

means for setting the feedback frequency division ratio to an initial value during a first period having a predetermined length, the initial value being selected to control the conduction time of the charge pump to place an amount of charge on the loop filter during the first period sufficient to produce a control voltage for controlling the voltage controlled oscillator to output an output signal substantially at the desired output frequency;

means for setting the feedback frequency division ratio to a proper value such that subsequent operation of the phase-locked loop locks the output frequency to the desired frequency; and a counter means arranged to count a first predetermined number of comparison periods of the phase comparator as said first period, wherein the means for setting the feedback frequency division ratio is selectively operable during the first period either to perform said control of the conduction time of the charge pump by setting the feedback frequency division ratio to the initial value or to set the feedback frequency division ratio to said proper value.

* * * * *